(12) United States Patent
Lin et al.

(10) Patent No.: US 6,737,679 B2
(45) Date of Patent: May 18, 2004

(54) OPTOELECTRONIC UNIT AND TRANSPARENT CONDUCTIVE SUBSTRATE OF THE SAME

(75) Inventors: Ming-Der Lin, Hsinchu (TW); Kwang-Ru Wang, Chia Yi (TW)

(73) Assignee: Highlink Technology Corporation, Hsinchu (TW)

( * ) Notice: Subject to any disclaimer, the term of this patent is extended or adjusted under 35 U.S.C. 154(b) by 0 days.

(21) Appl. No.: 10/336,820

(22) Filed: Jan. 6, 2003

(65) Prior Publication Data

US 2004/0069992 A1 Apr. 15, 2004

(30) Foreign Application Priority Data

Oct. 11, 2002 (TW) ........................................ 91123523 A

(51) Int. Cl.$^7$ ............................................. H01L 27/15
(52) U.S. Cl. .................... 257/79; 257/13; 257/103; 257/458; 257/749; 257/918; 438/22; 438/24; 438/29; 438/46; 438/47
(58) Field of Search .................... 257/13, 458, 79–103, 257/749, 918; 438/22, 24, 25, 28, 29, 46, 47

(56) References Cited

U.S. PATENT DOCUMENTS 5,014,100 A * 5/1991 Fukada et al. ............... 257/432
5,841,503 A * 11/1998 Yoshino et al. ............. 349/158

* cited by examiner

*Primary Examiner*—Huan Hoang
*Assistant Examiner*—Andy Huynh
(74) *Attorney, Agent, or Firm*—Sughrue Mion, PLLC

(57) ABSTRACT

An optoelectronic unit and a transparent conductive substrate of the same are disclosed. The transparent conductive substrate comprises a transparent plate, a transparent electrode film, an insulation part, and a bounding pad, wherein the transparent electrode film and the insulation part are formed on the transparent plate, the insulation part divides the transparent electrode film into a first transparent electrode film area and a second transparent electrode film area that non-conduct each other, and the bounding pad is formed on the second transparent electrode film area. The optoelectronic unit comprises the aforementioned transparent conductive substrate, an optoelectronic element, and a conductive wire, wherein one electrode of the optoelectronic element is electrically connected to the aforementioned first transparent electrode film area, and the other electrode of the optoelectronic element is electrically connected to the aforementioned bounding pad by the conductive wire.

19 Claims, 5 Drawing Sheets

OPTOELECTRONIC UNIT AND TRANSPARENT CONDUCTIVE SUBSTRATE OF THE SAME

FIELD OF THE INVENTION

The present invention relates to an optoelectronic unit and a transparent conductive substrate of the same, and more particularly, to a transparent conductive substrate used as an upper cover for an optoelectronic element, and to an optoelectronic unit having the transparent conductive substrate.

BACKGROUND OF THE INVENTION

Generally speaking, an optoelectronic device usually comprises a semiconductor optoelectronic element, and the property of the optoelectronic device is closely related to that of the optoelectronic element. Currently, one of the most commonly-used optoelectronic elements is a diode chip, which can be roughly divided into a light-emitting diode (LED) chip and a photodiode chip. Correspondingly, the optoelectronic device-can be roughly divided into a light-emitting element, such as a LED and a laser diode (LD), or a photodiode used as a photosensitive element, such as a photodetector and a solar cell, wherein the photodetector can be a photodiode (PD) or a positive-intrinsic-negative (PIN) diode, etc.

Herein a LED is taken as an example, and the structure thereof can be referred to U.S. Pat. No. 5,998,952. Such as shown in FIG. 1, a LED comprises a coating resin 101, a diode chip 102, a conductive wire 103, a molding material 104, a lead frame 105 and an inner lead 106, wherein the lead frame 105 comprises a base 105a and a lead 105b. Such as shown in FIG. 1, the coating resin 101 is filled in the base 105a and covers the diode chip 102, to prevent the diode chip 102 from contacting oxygen or moisture, thereby protecting the diode chip 102. The coating resin 101 is generally made of transparent material, such as epoxy resin, urea resin or glass, etc. Further, in the aforementioned LED shown in FIG. 1, light emitted by the diode chip 102 toward the base 105a cannot reach the outside, so that the emission light intensity and light emission efficiency are affected.

Furthermore, the photosensitive element can be a photodiode, a PIN diode, a phototransistor, a photonic crystal or a solar cell. The photodiode comprises a photodiode chip, which is a diode sensitive to light. When light directly irradiates a PN junction of the photodiode chip, the reverse current will be enlarged, and the photodiode is operated at the condition of reverse bias. The packaging of the photodiode chip is similar to that of the LED chip. A coating resin can be coated on the photodiode chip to prevent the photodiode chip from contacting oxygen or moisture, thereby protecting the photodiode chip.

However, although by using the coating resin coated to cover a LED chip or a photodiode chip, the chip can be protected from being oxidized or corroded by oxygen or moisture, etc., yet the coating resin still will be deteriorated and cured by the influence of heat and radiation, and the coating resin has poor heat-dissipation and little endurance to UV light, so that the coating resin is susceptible to the damage caused by UV rays in sunshine. Once the coating resin starts deteriorating, the chip covered thereby will be affected and damaged. Especially for the element of which the waveband of light emitted is below that of blue light (wherein the wavelength of emitted light is smaller than 480 nm), because the LED chip thereof has the attribute of spontaneous irradiation, and additionally, the light traveling path thereof is concentrated within a specific angle so as to result in high light emission intensity, consequently, the damage to the coating resin is more sever. Besides, for the photodiode, one side thereof facing the base cannot receive external light because of packaging, so that the aforementioned method adopted also has great influence on the photosensitivity of the photodiode.

To sum up, it is quite important about how to provide an optoelectronic device for protecting the optoelectronic element from damage and influence caused by the deterioration of the coating resin, and meanwhile promoting the light emission (or detection) efficiency, operation stability and operation life, etc. for the optoelectronic element (or a lightemitting element), so as to promote the reliability of the element.

SUMMARY OF THE INVENTION

For overcoming the conventional problems described in the aforementioned background, one object of the present invention is to provide an optoelectronic unit and a transparent conductive substrate of the same, thereby isolating an optoelectronic element.

It is the other object of the present invention to provide an optoelectronic unit and a transparent conductive substrate of the same, for enabling active optoelectronic elements and passive optoelectronic elements to emit light outwards or receive light from two sides thereof arbitrarily.

According to the aforementioned objects, the present invention provides a transparent conductive substrate of an optoelectronic unit, which is characterized in that an optoelectronic element is implemented on a transparent conductive substrate, and then the transparent conductive substrate is turned upside down to cover a base, so that the optoelectronic element is located in a substantially closed space. As to the transparent conductive substrate of the optoelectronic unit according to the present invention, it comprises: a transparent plate, a transparent electrode film, an insulation part, and a bounding pad, wherein the transparent electrode film and the insulation part are formed on the transparent plate, and the insulation part divides the transparent electrode film into two areas that are not electrically conducted to each other, and the bounding pad is formed on an area of the transparent electrode film.

According to the aforementioned objects, the present invention provides an optoelectronic unit comprising: a transparent conductive substrate, an optoelectronic element arid a conductive wire, wherein the structure of the transparent conductive substrate is descried as above, and the insulation part divides the transparent conductive film into a first transparent electrode film area and a second transparent electrode film area that ate not electrically conducted to each other, and the bounding pad is formed on the second transparent electrode film area, and one electrode of the optoelectronic element is electrically connected to the first transparent electrode film area, and the conductive wire is electrically connected between the other electrode of the optoelectronic element and the bounding pad. Further, the present invention can have a base, on which the aforementioned transparent conductive substrate is disposed after being turned upside down, and a closed space is formed between the transparent conductive substrate and the base, wherein the aforementioned bounding pad, the optoelectronic element and the conductive wire are located in the closed space.

Moreover, in the present invention, the transparent electrode film, the first transparent electrode film area and the second transparent electrode film area can be made of transparent film material selected from a group consisting of such as ITO, ZnO, CTO, IZO, $ZrO_2$, AZO, and the compound layer thereof. Besides the aforementioned materials, a thin metal electrode can be used as the transparent film electrode, wherein the thin metal electrode is formed by a plurality of metal layers arbitrarily selected from a group consisting of nickel, silver, aluminum, titanium, chromium, gold, platinum, tungsten, tungsten silicide, zinc, imdium and aluminum-silicon alloys, etc. Meanwhile, the aforementioned optoelectronic can be a LED element or a photosensitive element.

Since the optoelectronic element of the present invention is implemented on a transparent conductive substrate, the optoelectronic element can be isolated from the surroundings. Also, since the transparent conductive substrate allows light to pass through, the LED element can emit light outwards from its two sides, and photosensitive element can also receive light from its two sides.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Hereinafter, a transparent conductive substrate and an optoelectronic unit are explained by referring to the related figures, according to preferred embodiments of the present invention, wherein same reference numbers are used for the same elements for explanation.

Figure 1:
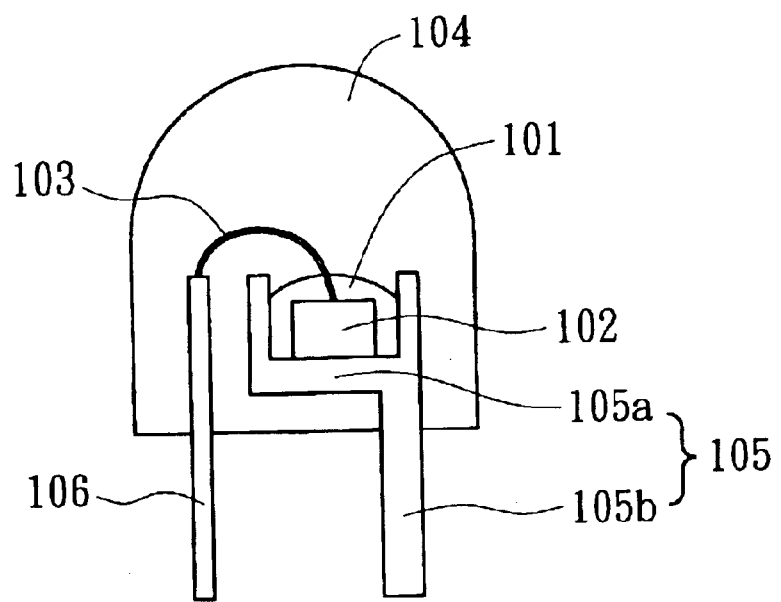
FIG. 1 is a cross-sectional schematic diagram showing a conventional LED.
Figure 2:
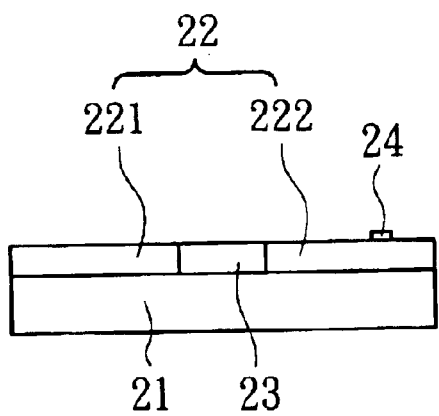
FIG. 2 is a cross-sectional schematic diagram showing a transparent conductive substrate of an optoelectronic unit, according to a preferred embodiment of the present invention.

Please refer to FIG. 2, according to a preferred embodiment of the present invention, a transparent conductive substrate comprises a transparent plate 21, a transparent electrode film 22, an insulation part 23 and a bounding pad 24, wherein the insulation part 23 divides the transparent electrode film 22 into a first transparent electrode film area 221 and a second transparent electrode film area 222, and the bounding pad 24 is formed on the second transparent electrode film area 222.

In the present embodiment, the transparent plate 21 is made of light-permissible material, such as an $Al_2O_3$ substrate, a ceramic substrate, an amorphous substrate or a polymer material, wherein the $Al_2O_3$ substrate can be such as a sapphire substrate; the amorphous substrate can be such as glass; and the polymer material can be such as an acrylic plate. The transparent plate 21 can support the transparent electrode film 22, the insulation part 23 formed thereon and an optoelectronic element (not shown) formed later, and provide the functions of isolating oxygen, moisture and surroundings, wherein the transparent electrode film 22, the insulation part 23 and the optoelectronic element are formed on the top of the transparent plate 21.

The material forming the transparent electrode film 22 can be one or a plurality of transparent conductive films, such as ITO, ZnO, CTO, IZO, $ZrO_2$ or AZO, etc. Since these oxides has the transparent and electrically-conductive feature, they are one of the most popular electrically-conductive materials utilized in the optoelectronic industry. Besides the aforementioned transparent conductive materials, a thin metal electrode can be used as the transparent film electrode, wherein the thin metal electrode is formed by a plurality of metal layers arbitrarily selected from a group consisting of nickel, silver, aluminum, titanium, chromium, gold, platinum, tungsten, tungsten silicide, zinc, indium and aluminum-silicon alloy, etc.

After the transparent electrode film 22 is formed, the pattern of the insulation part 23 is defined on the transparent electrode film 22. Thereafter, an etching process and a step of depositing insulation material (or dielectric material) are performed, or the method combining an etching process and a deposition step is performed, to form the insulation part 23.

Further, according to the preferred embodiment of the present invention, an optoelectronic unit comprises an optoelectronic element, a transparent substrate and a conductive wire. The optoelectronic element can be a light-emitting element, or a photosensitive element In the below, the preferred embodiment of the present invention is explained by an example using the light-emitting element as a LED.

Figure 3A:
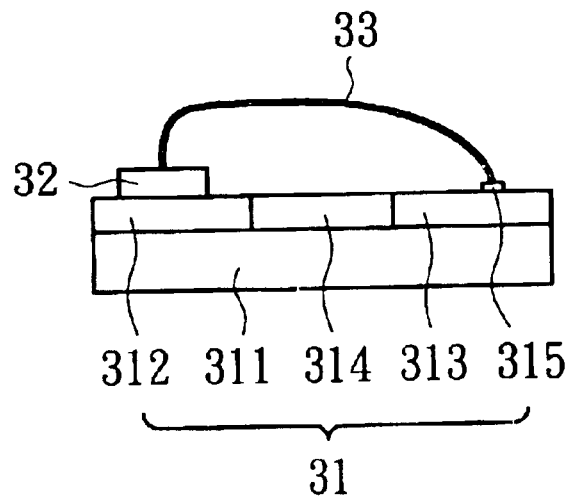
FIG. 3A is a cross-sectional schematic diagram showing the optoelectronic unit, according to a preferred embodiment of the present invention.

Please refer to FIG. 3A. According to the preferred embodiment of the present invention, an optoelectronic element used for an optoelectronic device comprises a transparent conductive substrate 31; a LED chip 32 and a conductive wire 33. In the present embodiment, the transparent conductive substrate 31 comprises a transparent plate 311, a first transparent electrode film area 312, a second electrode film area 313, an insulation part 314 and a bounding pad 315, wherein the first transparent electrode film area 312 and the second electrode film area 313 are divided by the insulation part 314 and are not electrically conducted to each other, and the bounding pad 315 is formed on the second electrode film area 313.

Besides, one electrode of the LED chip 32 is electrically connected to the bounding pad 315 via the conductive wire 33, and the other electrode of the LED chip 32 is fixed on the first electrode film area 312 with an electrically-conductive adhesive.

Figure 3B:
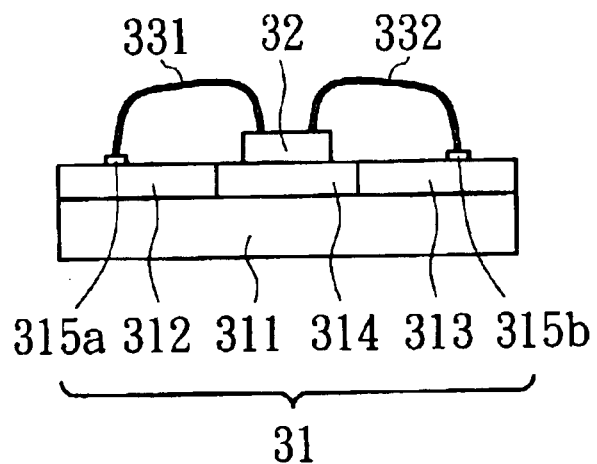
FIG. 3B is a cross-sectional schematic diagram showing an optoelectronic unit, according to the other preferred embodiment of the present invention.

Please refer to an optoelectronic unit used for an optoelectronic as shown in FIG. 3B, according to the other preferred embodiment of the present, invention. The optoelectronic unit shown in FIG. 3B comprises a transparent conductive substrate 31, a LED chip 32, a first conductive wire 331 and a second conductive wire 332. In the present embodiment, the transparent conductive substrate 31 comprises a transparent plate 311, a first transparent electrode film area 312, a second transparent electrode film area 313, an insulation part 314, a first bounding pad 315a and a second bounding pad 315b, wherein the first transparent electrode film area 312 and the second transparent electrode film area 313 are divided by the insulation part 314 and are not mutually conducted to each other, and the first bounding pad 315a and the second bounding pad 315b are formed respectively on the first transparent electrode film area 312 and the second transparent electrode film area 313.

The LED chip 32 shown in FIG. 3B is fixed on the insulation part 314 by an adhesive, wherein the adhesive can be light permissible or impermissible material that is conductive or non-conductive, such as $TiO_2$, epoxy, polyimide, or silver epoxy, etc. Two electrodes of the LED chip 32 are electrically connected to the first bounding pad 315a and the second bounding pad 315b respectively via the first conductive wire 331 and the second conductive wire 332. Therefore, the first transparent electrode film area 312 and the second transparent electrode film area 313 can be used respectively for inputting current to those two electrodes of the LED chip 32.

Figure 4A:
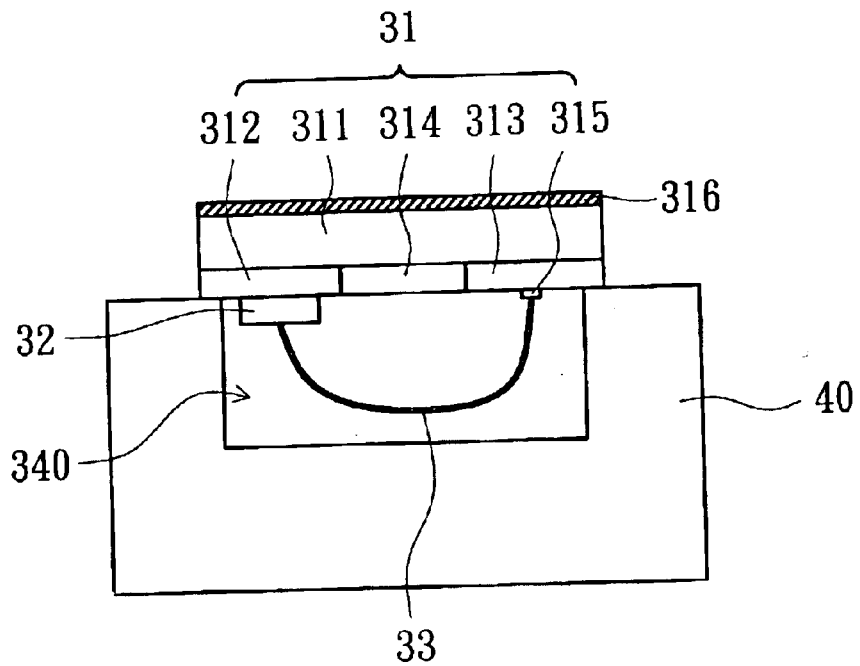
FIG. 4A is a cross-sectional schematic diagram showing the optoelectronic unit coordinated with a base according to the preferred embodiment of the present invention, wherein at least one anti-reflection coating is located on the transparent substrate.

In the optoelectronic elements of the aforementioned preferred embodiments, the transparent conductive substrate 31 can be turned upside down and then disposed on a base 40 shown in FIG. 4A to be used as an upper cover. Meanwhile, the LED chip 32 is sealed in a tightly closed space 340, so that the LED 32 can be prevented from contacting oxygen and moisture, thereby avoiding being oxidized, corroded and other bad influences. Besides, the space 340 can be filled with gas, liquid or colloid, etc, so as to assist heat dissipation; to promote light emission efficiency; and to alleviate the oxidation and moistening of element.

Moreover, since the transparent conductive substrate 31 allows light to pass through, the optoelectronic ship 32 can emit light form its two sides.

Figure 4B:
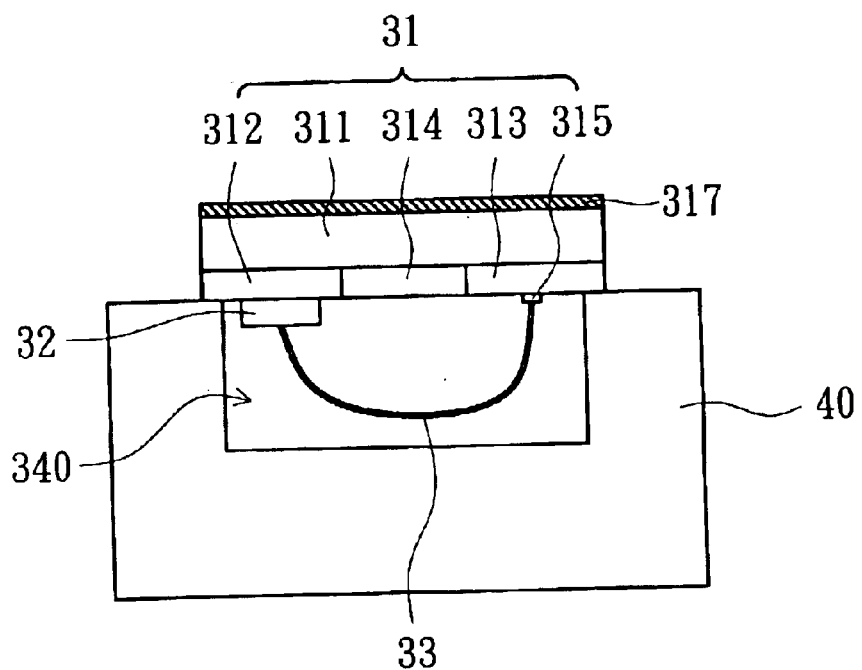
FIG. 4B is a cross-sectional schematic diagram showing the optoelectronic unit coordinated with a base according to the preferred embodiment of the present invention, wherein at least one optically-filtering coating is located on the transparent substrate.

In order to obtain the best performance of active optoelectronic elements or passive optoelectronic elements using the transparent conductive substrate 31 as a packaging carrier, the following treatments are performed. For example, at least one layer of anti-reflection coating (AR Coating) 316 can be formed on the surface of the transparent conductive substrate 31 in accordance with the wavelength of light emitted from the active element, so as to increase light emission efficiency. Similarly, the anti-reflection coating 316 can also be applied to the passive elements, so as to decrease the reflection generated by external light from the surface of the transparent conductive substrate 31, thereby enhancing the light incident efficiency and promoting the sensitivity of photosensitive elements. The anti-reflection coating 316 can be made of one or a plurality of stacked structures, and the material thereof can be selected from a group consisting of $SiO_2$, $SiO_x$, $SiN_x$, $TiO_2$, $Ta_2O_5$, TEOS, epoxy resin, ITO, ZnO, CTO, IZO, $ZrO_2$, AZO and polyimide, etc. Moreover, in applying the film technology, at least one layer of optically-filtering coating 317 can be further formed on the surface of-the transparent conductive substrate 31 in accordance with the optical theory, so as to have the filtering function, such as shown in FIG. 4B. Thus, some, unwanted spectrums can be filtered out, and the wavelength of light emitted from the active elements can be accurately controlled. The aforementioned advantages enable the transparent conductive substrate 31 to be quite suitable for use in the optoelectronic elements of double crystal structure; triple crystal structure; or needing light mixed On the other hand, the transparent conductive substrate 31 having the filtering function also can filter out the light that is harmful to human bodies or causes interference to instruments, such as UV light or infrared (IR). From the viewpoint of applying the passive elements, the transparent conductive substrate 31 having the filtering function can promote the signal/noise ratio (S/N Ratio) of the passive elements, and enhance the operation sensitivity thereof greatly. Further, the optically-filtering coating 317 can be made of one or a plurality of stacked structures, and the material thereof can be selected from a group consisting of $SiO_2$, $SiO_x$, $SiN_x$, $TiO_2$, $Ta_2O_5$, TEOS, epoxy resin, ITO, ZnO, CTO, IZO, $Zro_2$, AZO and polyimide, etc.

Figure 4C:
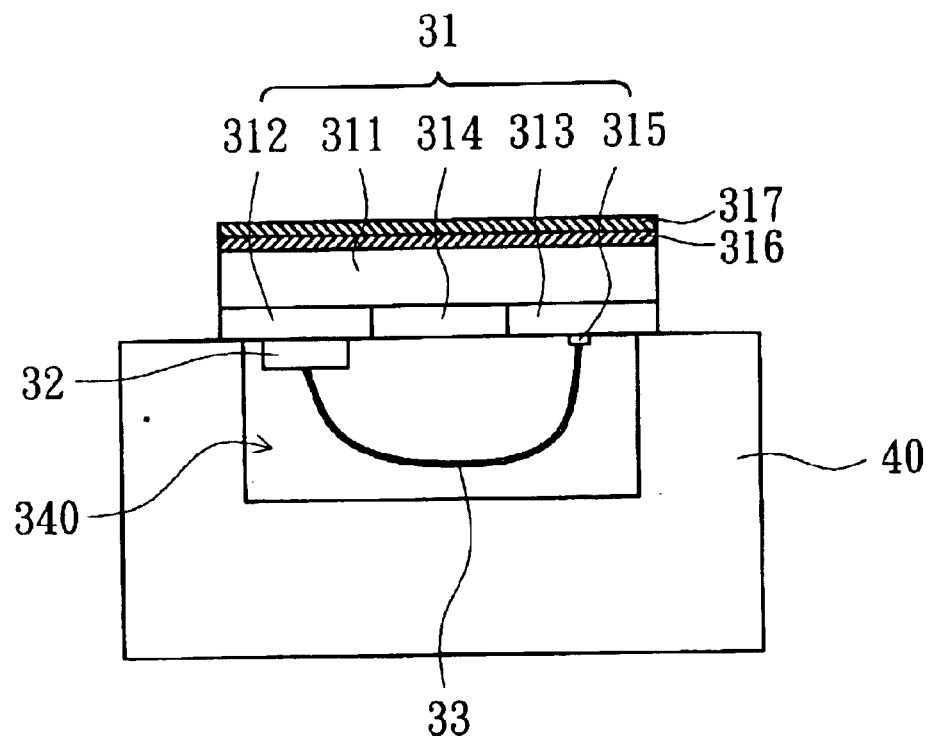
FIG. 4C is a cross-sectional schematic diagram showing the optoelectronic unit coordinated with a base according to the preferred embodiment of the present invention, wherein at least one anti-reflection coating and at least one optically-filtering coating are located on the transparent substrate simultaneously; and FIG. 5A to FIG. 5E illustrates five different shapes of the transparent plate of the present invention.
Figure 5A:
Figure 5B:
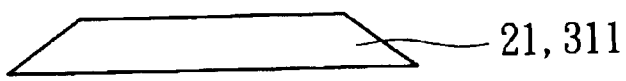
Figure 5C:
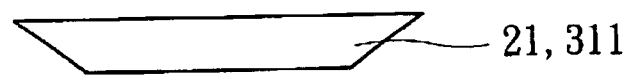
Figure 5D:
Figure 5E:

It can be understood by those who are skilled in the art that the at least one layer of the aforementioned anti-reflection coating 316 and at least one layer of the aforementioned optically-filtering coating 317 can be formed at the same time on the transparent conductive substrate 31, such as shown in FIG. 4C.

Further, the shape of the aforementioned transparent plate 21 shown in FIG. 2 and that of the transparent plate 311 shown in FIG. 3A to FIG. 4C, can be rectangular, trapezoid, inverted-trapezoid, bell shape or bowl shape, etc., such as shown in FIG. 5A to FIG. 5E. However, the scope claimed by the present invention is not limited thereto, but includes any shape that can perform the functions of the transparent plate 21 and the transparent plate 311.

Moreover, those who are skilled in the art should be able to easily use the photosensitive elements to replace the light-emitting elements of the aforementioned embodiments, so that the embodiments using the photosensitive elements will not be described herein.

To sum up, according to the preferred embodiments of the present invention, the optoelectronic unit and the transparent conductive substrate thereof can implement the optoelectronic element on the transparent conductive substrate, so as to isolate the optoelectronic element from contacting oxygen or moisture in the surroundings, so that the optoelectronic element can be effectively protected. Also, since the transparent conductive substrate allows light to pass through, the active optoelectronic elements can emit light form its two sides, the passive optoelectronic elements can receive light from its-two sides.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A transparent conductive substrate of an optoelectronic unit, wherein said transparent conductive substrate comprises:
   a transparent plate;
   a transparent electrode film, formed on said transparent plate;
   an insulation part, formed on said transparent plate, wherein said insulation part divides said transparent electrode film into two areas that are not mutually conducted to each other; and a bounding pad, formed on one of said two areas that are not mutually conducted to each other.

2. The transparent conductive substrate of the optoelectronic unit according to claim 1, wherein the material forming said transparent plate is selected form a group consisting of an Al2 O3 substrate, a ceramic substrate, an amorphous substrate and a polymer material.

3. The transparent conductive substrate of the optoelectronic unit according to claim 1, wherein the material forming said transparent electrode film is selected from a group consisting of ITO, ZnO, CTO, IZO, ZrO2 and AZO.

4. The transparent conductive substrate of the optoelectronic unit according to claim 1, wherein the material forming said transparent electrode film is selected from a group consisting of nickel, silver, aluminum, titanium, chromium, gold, platinum, tungsten, tungsten silicide, zinc, indium and aluminum-silicon alloys.

5. The transparent conductive substrate of the optoelectronic unit according to claim 1, wherein the material forming said transparent electrode film is selected from a group consisting of ITO, ZnO, CTO, IZO, ZrO2, AZO, nickel, silver, aluminum, titanium, chromium, gold, platinum, tungsten, tungsten silicide, zinc, indium and aluminum-silicon alloys.

6. The transparent conductive substrate of the optoelectronic unit according to claim 1, wherein the shape of said transparent substrate is selected from a group consisting of a rectangle, a trapezoid, an inverted-trapezoid, a bell shape and a bowl shape.

7. An optoelectronic unit, comprising:
a transparent conductive substrate, wherein a first transparent electrode film area and a second transparent electrode film area are formed on said transparent conductive substrate, and said first transparent electrode film area and said second transparent electrode film area are not mutually conducted to each other, and a bounding pad is formed on said second transparent electrode film area; comprising:
a transparent plate;
a first transparent electrode film area and a second transparent electrode film area, formed on said transparent plate, wherein said first transparent electrode film area and said second transparent electrode film area are not mutually conducted to each other; and
a bounding pad, formed on said second transparent electrode film area;
an optoelectronic element, wherein one electrode of said optoelectronic element is connected to said first transparent electrode film area; and
a conductive wire, wherein one end of said conductive wire is electrically connected to the other electrode of said optoelectronic element and the other end of said conductive wire is electrically connected to said bounding pad.

8. The optoelectronic unit of claim 7, wherein the material forming said first transparent electrode film area and said second transparent electrode film area is selected from a group consisting of ITO, ZnO, CTO, IZO, ZrO2 and AZO.

9. The optoelectronic unit of claim 7, wherein the material forming said first transparent electrode film area and said second transparent electrode film area is selected from a group consisting of nickel, silver, aluminum, titanium, chromium, gold, platinum, tungsten, tungsten silicide, zinc, indium and aluminum-silicon alloys.

10. The optoelectronic unit of claim 7, wherein the material forming said first transparent electrode film area and said second transparent electrode film area is selected from a group consisting of ITO, ZnO, CTO, IZO, ZrO2, AZO, nickel, silver, aluminum, titanium, chromium, gold, platinum, tungsten, tungsten silicide, zinc, indium and aluminum-silicon alloys.

11. The optoelectronic unit according of claim 7, wherein said optoelectronic element is selected from a group consisting of a light-emitting element and a photosensitive element.

12. An optoelectronic unit, comprising:
a transparent conductive substrate, wherein a first transparent electrode film area and a second transparent electrode film area are formed on said transparent conductive substrate, and said first transparent electrode film area and said second transparent electrode film area are not mutually conducted to each other, and a bounding pad is formed on said second transparent electrode film area; comprising:
a transparent plate;
a first transparent electrode film area and a second transparent electrode film area, formed on said transparent plate, wherein said first transparent electrode film area and said second transparent electrode film area are not mutually conducted to each other; and
a bounding pad, formed on said second transparent electrode film area;
an optoelectronic element, wherein one electrode of said optoelectronic element is connected to said first transparent electrode film area;
a conductive wire, wherein one end of said conductive wire is electrically connected to the other electrode of said optoelectronic element and the other end of said conductive wire is electrically connected to said bounding pad; and
a base, wherein said transparent conductive substrate is turned upside down and disposed on said base, and a closed space is formed between said transparent conductive substrate and said base, and said bounding pad, said optoelectronic element and said conductive wire are located in said closed space.

13. The optoelectronic unit of claim 12, wherein the material forming said first transparent electrode film area and said second transparent electrode film area is selected from a group consisting of ITO, ZnO, CTO, IZO, ZrO2 and AZO.

14. The optoelectronic unit of claim 12, wherein the material forming said first transparent electrode film area and said second transparent electrode film area is selected from a group consisting of nickel, silver, aluminum, titanium, chromium, gold, platinum, tungsten, tungsten silicide, zinc, indium and aluminum-silicon alloys.

15. The optoelectronic unit of claim 12, wherein the material forming said first transparent electrode film area and said second transparent electrode film area is selected from a group consisting of ITO, ZnO, CTO, IZO, ZrO2, AZO, nickel, silver, aluminum, titanium, chromium, gold, platinum, tungsten, tungsten silicide, zinc, indium and aluminum-silicon alloys.

16. The optoelectronic unit according of claim 12, wherein said optoelectronic element is selected from a group consisting of a light-emitting element and a photosensitive element.

17. The optoelectronic unit according of claim 12, wherein at least one anti-reflection coating (AR Coating) is further formed on said transparent conductive substrate.

18. The optoelectronic unit according of claim 12, wherein at least one optically-filtering coating is further formed on said transparent conductive substrate.

19. The optoelectronic unit according of claim 12, wherein at least one anti-reflection coating and at least one optically-filtering coating are further formed on said transparent conductive substrate.

* * * * *